(12) United States Patent
Punjabi et al.

(10) Patent No.: US 11,564,317 B2
(45) Date of Patent: *Jan. 24, 2023

(54) INTEGRATED POWER DELIVERY BOARD FOR DELIVERING POWER TO AN ASIC WITH BYPASS OF SIGNAL VIAS IN A PRINTED CIRCUIT BOARD

(71) Applicant: CISCO TECHNOLOGY, INC., San Jose, CA (US)

(72) Inventors: Shobhana Punjabi, San Jose, CA (US); Kan Seto, Saratoga, CA (US); Straty Argyrakis, San Jose, CA (US); Joel Richard Goergen, Soulsbyville, CA (US); Paul Lachlan Mantiply, Palo Alto, CA (US); Richard Anthony O'Brien, Livermore, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 17/220,033

(22) Filed: Apr. 1, 2021

(65) Prior Publication Data

US 2021/0219426 A1      Jul. 15, 2021

Related U.S. Application Data

(63) Continuation of application No. 16/222,913, filed on Dec. 17, 2018, now Pat. No. 10,999,930.

(51) Int. Cl.
  *H05K 1/14*   (2006.01)
  *H05K 1/18*   (2006.01)
  (Continued)

(52) U.S. Cl.
  CPC .......... *H05K 1/141* (2013.01); *H05K 1/0263* (2013.01); *H05K 1/115* (2013.01); *H05K 1/144* (2013.01); *H05K 1/181* (2013.01); *H05K 2201/093* (2013.01); *H05K 2201/096* (2013.01); *H05K 2201/10522* (2013.01); *H05K 2201/10545* (2013.01)

(58) Field of Classification Search
  CPC ...... H05K 1/0263; H05K 1/115; H05K 1/141; H05K 1/144; H05K 1/181; H05K 2201/093; H05K 2201/096; H05K 2201/10522; H05K 2201/10545
  See application file for complete search history.

(56) References Cited

U.S. PATENT DOCUMENTS 5,574,630 A * 11/1996 Kresge ................ H01L 23/5384
                                                257/E23.079
6,414,391 B1    7/2002 Corisis
(Continued)

*Primary Examiner* — Nathan Milakovich

(57) ABSTRACT

In one embodiment, an apparatus generally comprises a printed circuit board comprising a first side, a second side, and a plurality of power vias extending from the first side to the second side, the first side configured for receiving an application specific integrated circuit (ASIC), and a power delivery board mounted on the second side of the printed circuit board and comprising a power plane interconnected with power vias in the power delivery board to electrically couple voltage regulator modules and the ASIC. The voltage regulator modules are mounted on the second side of the printed circuit board.

20 Claims, 4 Drawing Sheets

(51) Int. Cl.
*H05K 1/02* (2006.01)
*H05K 1/11* (2006.01)

(56) References Cited

U.S. PATENT DOCUMENTS

| | | |
|---|---|---|
| 6,418,029 B1 | 7/2002 | McKee |
| 6,791,846 B2 | 9/2004 | Smith |
| 6,870,252 B2 | 3/2005 | Novak |
| 6,930,893 B2 | 8/2005 | Vinciarelli |
| 8,815,650 B2 | 8/2014 | Pagalia |
| 10,096,582 B2 | 10/2018 | Mantiply |
| 2006/0109625 A1 | 5/2006 | Harris |
| 2006/0181857 A1 | 8/2006 | Belady |
| 2006/0187646 A1 | 8/2006 | Belson |
| 2007/0075431 A1 | 4/2007 | Miyazaki |
| 2008/0116589 A1 | 5/2008 | Li |
| 2010/0148344 A1 | 6/2010 | Chandra |
| 2012/0081859 A1* | 4/2012 | Christo ................ H05K 1/0296 361/736 |
| 2017/0290158 A1 | 10/2017 | Pihlman |
| 2018/0012879 A1 | 1/2018 | Mantiply |
| 2018/0186627 A1 | 7/2018 | Ofner |
| 2020/0411494 A1 | 12/2020 | Hovis |
| 2020/0411495 A1 | 12/2020 | Hovis |

\* cited by examiner

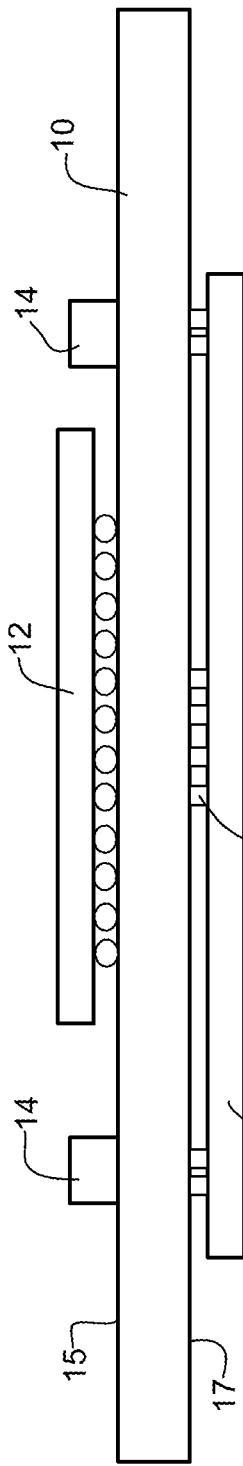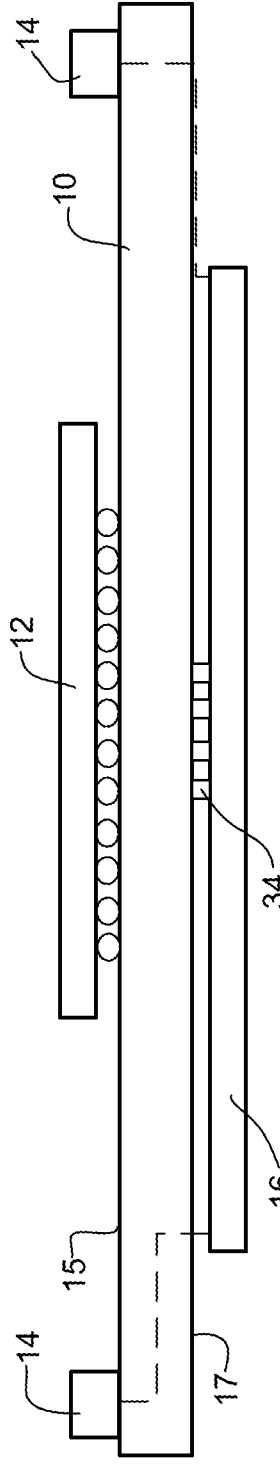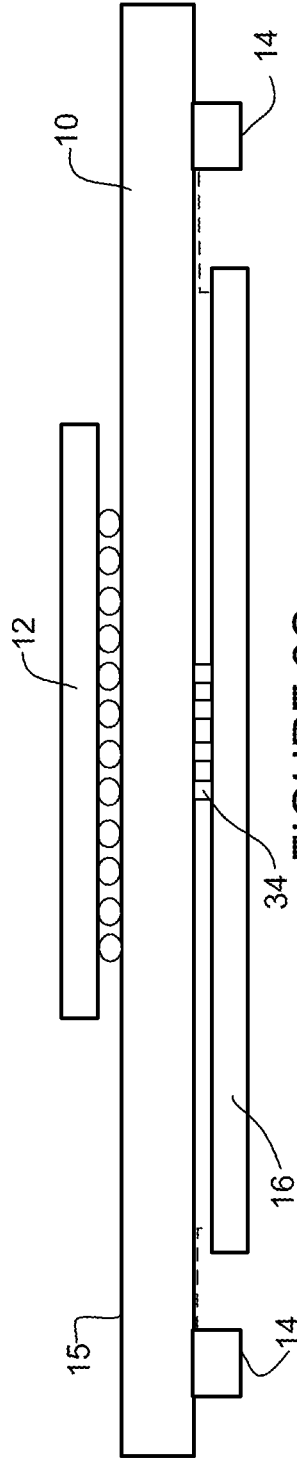

INTEGRATED POWER DELIVERY BOARD FOR DELIVERING POWER TO AN ASIC WITH BYPASS OF SIGNAL VIAS IN A PRINTED CIRCUIT BOARD

STATEMENT OF RELATED APPLICATION

The present application is a continuation of U.S. patent application Ser. No. 16/222,913, entitled INTEGRATED POWER DELIVERY BOARD FOR DELIVERING POWER TO AN ASIC WITH BYPASS OF SIGNAL VIAS, filed Dec. 17, 2018. The content of this application is incorporated herein by reference in its entirety.

TECHNICAL FIELD

The present disclosure relates generally to power delivery, and more particularly, to power delivery to an ASIC (Application Specific Integrated Circuit) mounted on a printed circuit board.

BACKGROUND

As ASIC process nodes advance and device currents continue to increase in support of even higher very large scale integration (VLSI) gate counts, delivering requisite power to ASICs is becoming more challenging. Power distribution through traces in a conventional printed circuit board plane often results in significant voltage drop and high current density since the plane region below the ASIC is typically heavily perforated by through-hole-vias.

BRIEF DESCRIPTION OF THE DRAWINGS

FIG. 2A is a schematic side view illustrating one example of the power delivery board, ASIC, and voltage regulator modules mounted on the printed circuit board.

FIG. 2B is a schematic side view illustrating another example of the power delivery board, ASIC, and voltage regulator modules mounted on the printed circuit board.

FIG. 2C is a schematic side view illustrating yet another example of the power delivery board, ASIC, and voltage regulator modules mounted on the printed circuit board.

Corresponding reference characters indicate corresponding parts throughout the several views of the drawings.

DESCRIPTION OF EXAMPLE EMBODIMENTS

Overview

Figure 1:
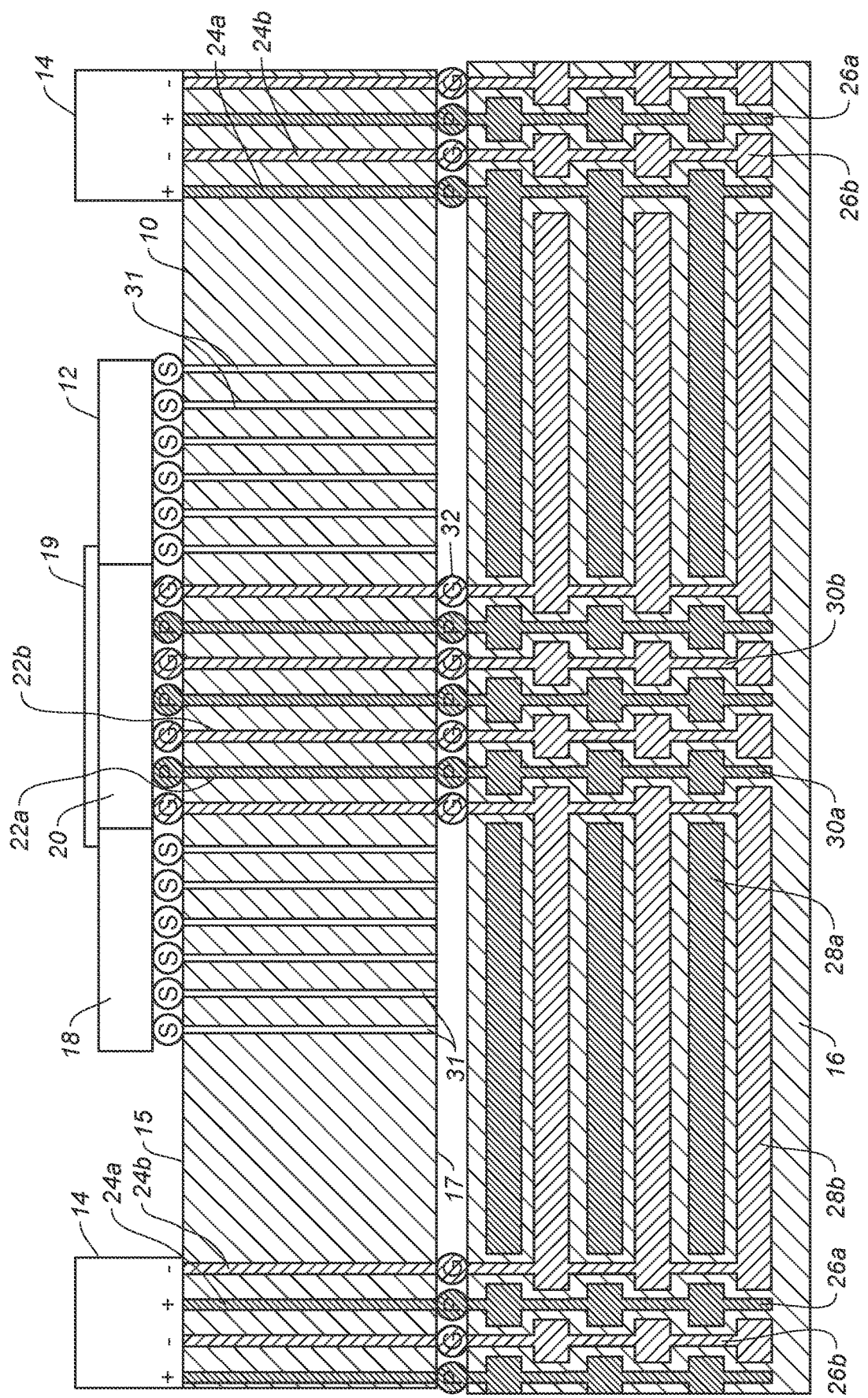
FIG. 1 is a schematic cross-sectional view of a power delivery board mounted on a bottom side of a printed circuit board with voltage regulator modules and an ASIC mounted on a top side, in accordance with one embodiment.

In one embodiment, an apparatus generally comprises a power delivery board for integration with a printed circuit board, the power delivery board comprising a power plane for delivering power from a voltage regulator module to an application specific integrated circuit (ASIC) mounted on a first side of the printed circuit board. The power plane in the power delivery board interconnects with power vias in the power delivery board for vertical alignment with the ASIC through power vias in the printed circuit board to electrically couple the voltage regulator module and the ASIC when the power delivery board is mounted on a second side of the printed circuit board.

In one embodiment, the power delivery board electrically couples a plurality of voltage regulators mounted on the first side of the printed circuit board with the ASIC. The printed circuit board comprises signal vias surrounding a portion of the power vias in the printed circuit board. The power vias in the power delivery board comprise a central group of power vias vertically aligned with a core of the ASIC. The power plane may comprise a plurality of power planes interconnecting the power vias in the power delivery board. A ground plane in the power delivery board interconnects a plurality of ground vias for alignment with ground vias in the printed circuit board. The power delivery board may be attached to the printed circuit board with a ball grid array or a land grid array, for example.

In another embodiment, an apparatus generally comprises a printed circuit board comprising a first side, a second side, and a plurality of power vias extending from the first side to the second side. The first side is configured for receiving an application specific integrated circuit (ASIC). The apparatus further comprises a power delivery board mounted on the second side of the printed circuit board and comprising a power plane interconnected with power vias in the power delivery board for vertical alignment with the ASIC through the power vias in the printed circuit board to electrically couple a voltage regulator module and the ASIC.

In yet another embodiment, an apparatus generally comprises a printed circuit board comprising a first side, a second side, and a plurality of vias extending from the first side to the second side, voltage regulator modules mounted on the printed circuit board, application specific integrated circuits (ASICs) mounted on the first side of the printed circuit board, and power delivery boards mounted on the second side of the printed circuit board at locations aligned with the ASICs, each of the power delivery boards comprising a power plane for delivering power from at least one of the voltage regulator modules to one of the ASICs to electrically couple the voltage regulator module and the ASIC.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Voltage regulator modules (VRMs) are typically mounted on a top side (first side) of a printed circuit board, in horizontal alignment with an ASIC (Application Specific Integrated Circuit). In conventional systems, power is distributed from the VRM through traces in a PCB (Printed Circuit Board) plane (power plane) to the ASIC. High current ASICs typically have hundreds of pins and fan out vias for these pins result in many holes in copper traces in a printed circuit board on which the ASIC is mounted. Conventional printed circuit board designs in which ASIC signal vias are routed through power and ground planes results in power plane perforation. Thus, as power travels through the PCB, there may be a significant voltage drop across the PCB (e.g., significant IR-drop). In order to deliver power to the ASICs, the current has to travel through the severely cut copper. This typically results in the addition of many copper planes to make up for the copper loss and deliver current with a reasonable current density. Delivering power through the PCB consumes valuable PCB resources in terms of both PCB area and copper layers, thereby limiting PCB density.

The embodiments described herein provide an integrated power delivery board (also referred to as a PCB bus bar or power board) mounted below a PCB for connecting power and ground outside of the ASIC signal pin field. The integrated power delivery board allows for high currents to be delivered directly to ASIC pins through one or more aligned via (vertical interconnect access) and provides improved current density and efficiency by reducing IR drop loss and layer count on the PCB. As described below, one or more power delivery boards may be added to the PCB locally where needed to reduce current density in the region of the ASIC.

It should be noted that the terms, bottom, top, lower, upper, below, above, horizontal, vertical, and the like as used herein are relative terms dependent upon the orientation of the printed circuit board and network device and should not be interpreted in a limiting manner. These terms describe points of reference and do not limit the embodiments to any particular orientation or configuration.

The embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise a power delivery board integrated with a printed circuit board to distribute power to an ASIC with bypass of signal vias in the printed circuit board, as described below. The network device may further include any combination of memory, processors, power supply units, and network interfaces.

Referring now to the drawings, and first to FIG. 1, a cross-sectional schematic of a portion of a printed circuit board 10 is shown, in accordance with one embodiment. In the example shown in FIG. 1, an ASIC 12 and two voltage regulator modules (VRMs) 14 are mounted on a first side (top side) 15 of the printed circuit board 10 and a power delivery board 16 is mounted on a second side (bottom side) 17 of the PCB. The first and second sides 15, 17 of the printed circuit board 10 are located on opposing sides of the printed circuit board and extend generally parallel to one another.

The ASIC 12 includes an ASIC package 18 and an ASIC die 19. A core 20 of the ASIC is aligned with power and ground vias 22a, 22b (through-hole-vias) in the printed circuit board 10 and receives power from the power delivery board 16, which distributes power received from the VRMs 14 through power vias 24a in the printed circuit board, as described in detail below.

The VRM 14 may receive input power at a standard intermediate voltage (e.g., 3V (volts) to approximately 54V (e.g., 12V or any other level)). The VRM 14 may then regulate this power down to ASIC specific voltages, which may range, for example, from approximately 0.6V to approximately 0.9V. The VRM 14 may comprise, for example, a buck type converter to down-regulate intermediate input power to ASIC specific voltages for use by memory or logic (e.g., bit cell or microprocessor) at the ASIC. The example in FIG. 1 shows two voltage regulator modules 14 providing power to the ASIC 12, however, any number of VRMs may be used (e.g., one or more), with each VRM providing one or more power and ground interfaces (two power interfaces and two ground interfaces shown for each VRM 14 in FIG. 1).

The printed circuit board 10 provides a dielectric material for copper or other conductive traces. The traces and pads are embedded within or deposited on the printed circuit board for connection with electronic components (e.g., ASIC 12). Etching, deposition, bonding, or other processes may be used to form the traces, pads, or embedded components (e.g., passive or active devices). The printed circuit board 10 may include one or more active devices (e.g., transistor, chip, processor, circuit, application specific integrated circuit, field programmable gate array, memory, etc.) and one or more passive devices (e.g., capacitor, resistor, inductor, connector, via, pad, etc.). Signal vias 31 are provided for routing traces through layers of the printed circuit board 10. The traces, pads, and electronic components may be arranged in any configuration to perform any number of functions (e.g., network server card, graphics card, motherboard, device card, and the like), or any other electronic part of a computer, router, switch, server, or other network device.

As shown in the example of FIG. 1, the printed circuit board 10 includes a plurality of power vias 22a, 24a and ground vias 22b, 24b. The power and ground vias 22a, 22b aligned with the ASIC 12 provide an electrical connection to the VRMs 14 through vertically aligned vias 30a, 30b in the power delivery board 16. The power and ground vias 24a, 24b located below the VRMs 14 are vertically aligned with power and ground vias 26a, 26b in the power delivery board 16. As described below, the power and ground vias 26a, 26b, 30a, 30b in the power delivery board 16 interconnect with power and ground planes 28a, 28b to electrically couple the VRMs 14 to the ASIC 12 through the power delivery board.

In one or more embodiments, the power board 16 comprises a plurality of the power and ground planes (horizontal traces) 28a, 28b that interconnect with the power and ground vias 26a, 26b aligned with the power and ground vias 24a, 24b of the PCB, in communication with the voltage regulator modules 14, and power and ground vias 30a, 30b aligned with the power and ground vias 22a, 22b of the PCB, in communication with the ASIC core 20. Power delivery (distribution) through the power board 16 allows the power and ground planes 28a, 28b to bypass the signal vias 31 in the PCB 10. The vertical power vias 22a provide lower loss as compared to a path on a perforated power plane since there are no perforations along the path causing dissipation. Power from the VRMs 14 runs horizontally through the power planes 28a in the power delivery board 16 and vertically to the ASIC 12 through the power vias 22a formed in the PCB 10 so that power does not need to be distributed along a highly perforated power plane. The path provided by the power planes 28a and interconnected power vias 26a, 30a in the power delivery board 16 frees up valuable layers in the PCB 10 as well as valuable area on the layers to improve product density. In one or more examples, PCB layer count may be reduced by moving the power planes to support the ASIC from the PCB 10 the power delivery board 16.

As shown in the example of FIG. 1, the power planes 28a in the power delivery board 16 deliver power from the voltage regulator modules 14 mounted on the first side 15 (top side in FIG. 1) of the printed circuit board 10 to the ASIC 12 mounted on the first side of the printed circuit board. The power planes 28a in the power delivery board 16 distribute power received at the power vias 26a from the VRM (through power vias 24a in the printed circuit board) to the power vias 30a in the power delivery board, which are vertically aligned with the power vias 22a in the printed circuit board to deliver power to the ASIC 12. As previously described, the power and ground planes 28a, 28b in the power delivery board 16 interconnect with the power and ground vias 22a, 22b, 24a, 24b in the printed circuit board 10 for vertical alignment with the ASIC 12 and voltage regulator modules 14 to electrically couple the voltage regulator modules and the ASIC when the power delivery board 16 is mounted on the second side 17 (bottom side in FIG. 1) of the printed circuit board 10.

It is to be understood that the layout, number, and arrangement of vias and planes shown in FIG. 1 is only an example and any other number of vias in the printed circuit board 10 and power delivery board 16 or planes in the power delivery board may be used without departing from the scope of the embodiments. For example, the VRM 14 may deliver power through one or more power vias 24a in the printed circuit board vertically aligned with one or more power vias 26a in the power delivery board. Also, there may be any number of power planes 28a in the power delivery board 16. In the example shown in FIG. 1, the number of power planes 28a corresponds to the number of power vias 22a in the printed circuit board 10 mating with power interfaces at the ASIC core 20. Similarly, there may be any number of power vias 30a in the power delivery board 16 aligned with a corresponding number of power vias 22a extending from the bottom side 17 of the printed circuit board 10 to the top side 15 of the PCB for interface with the ASIC 12. The printed circuit board 10 may contain any number of signal vias 31 for transmittal of signals to or from the ASIC 12. The signal vias 31 may connect to any number of traces (not shown) in the printed circuit board 10. As previously described, the power delivery board 16 removes the power planes from the PCB 10, thereby eliminating power plane perforation of the signal vias 31.

Furthermore, any number of voltage regulator modules may be mounted at any location on the PCB 10 or the power delivery board 16. For example, one or more VRMs 14 may be mounted on the same side of the PCB as the ASIC or on an opposite side of the PCB. As described below, the VRM may be vertically aligned with vias in the PCB or offset. Also, one or more VRMs 14 may be mounted on either side of the power delivery board 16.

FIG. 2A is a schematic side view of the printed circuit board 10, with the ASIC 12 and VRMs 14 mounted on the top side (first side 15) and the power delivery board 16 mounted on the bottom side (second side 17) of the PCB. The power delivery board 16 may be attached to the PCB 10 by soldering the power board to the PCB, such as with a ball grid array (BGA) 32 (FIG. 1), land grid array (LGA) 34 (FIG. 2A), or other suitable attachment means.

FIG. 2B is a schematic side view of another example of the printed circuit board 10 with the ASIC 12 and VRMs 14 mounted on the top side (first side 15) of the PCB. In this example, the via from the voltage regulator on the left side (as viewed in FIG. 2B) is shown (dashed line) connected to a power plane on the PCB and then connected through a via at an offset vertical location to the power delivery board 16. The VRM 14 mounted on the right side of the PCB 10 is shown connected to the bottom side of the PCB through a via (dashed line) and then to the power delivery board 16 with copper on the PCB.

FIG. 2C illustrates an example with the VRMs 14 mounted on a bottom side of the PCB 10 (same side as power delivery board 16). The power may be routed along a bottom side of the PCB 10, as shown in the example on the right in FIG. 2B, for example.

It is to be understood that the VRM mountings shown in FIGS. 2A, 2B, and 2C are only examples and that other mounting locations (e.g., on PCB 10 or power delivery board 16) or routing for delivery of power from the VRMs to the power delivery board may be used without departing from the scope of the embodiments. Also, as previously noted, any number of VRMs 14 may be used (e.g., one, two, or more) and each VRM may be mounted on the same side and use the same type of routing (e.g., vertically aligned via, offset vias with routing through power plane, routing on surface of PCB) or the VRMs may be mounted on different sides of the PCB or power delivery board or use different routing configurations.

Figure 3:
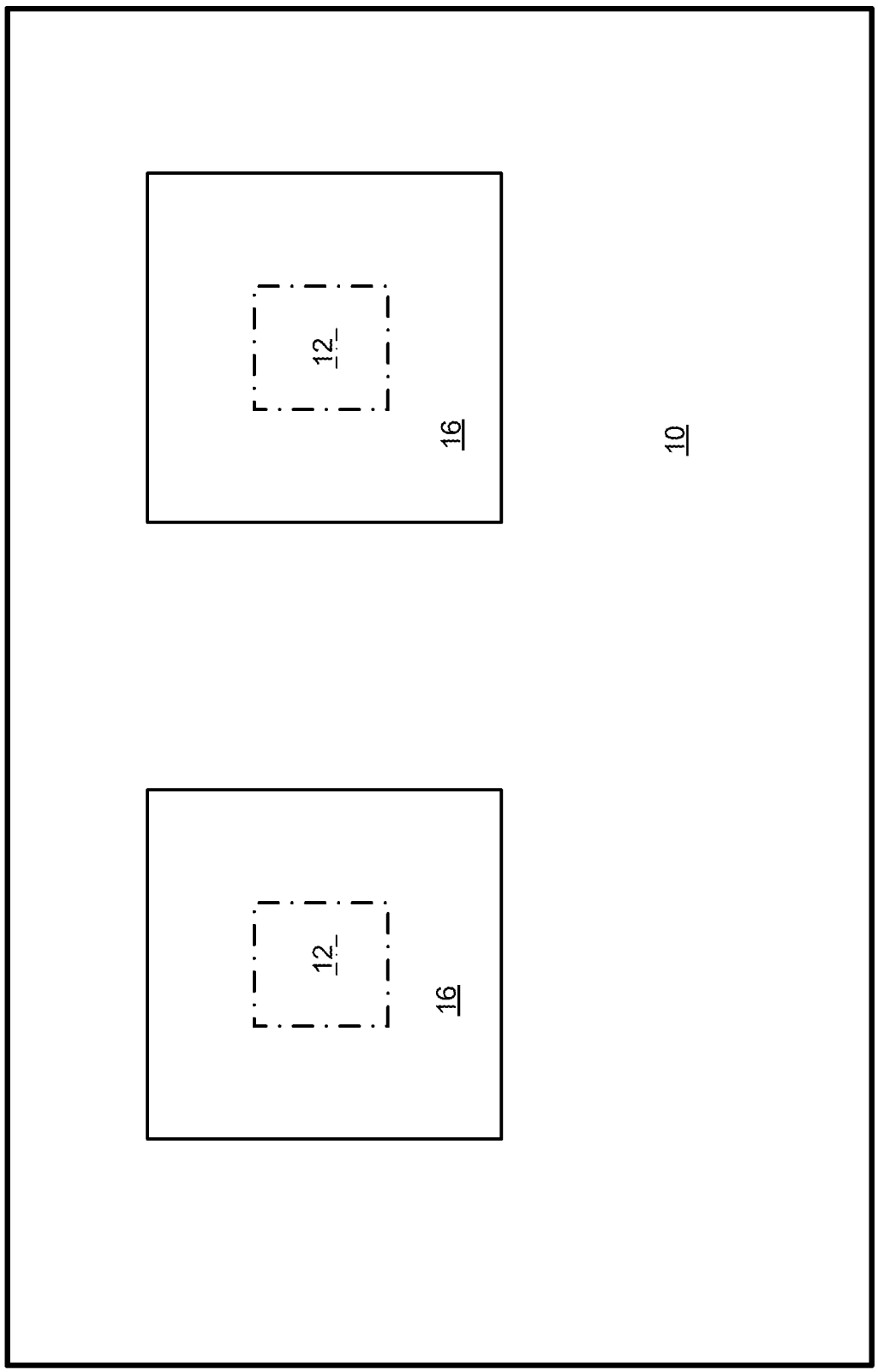
FIG. 3 is a bottom view of the printed circuit board with two power delivery boards mounted thereon for delivery to two ASICs mounted on the top of the printed circuit board and shown in phantom, in accordance with one embodiment.

FIG. 3 shows a bottom view of the printed circuit board 10 with two power delivery boards 16. The power delivery boards 16 are positioned locally in the region of the ASIC 12 (shown in phantom in FIG. 3). Thus, the power board 16 is added only locally where needed to reduce current density. By adding more layers locally, the overall thickness of the PCB does not need to be increased.

It is to be understood that the configuration shown in FIG. 3 is only an example and any number or arrangement of power delivery boards 16 may be used. For example, the printed circuit board 10 may comprise any number of ASICs 12 and voltage regulator modules 14 (FIGS. 1 and 2) mounted on a first side and any number of power delivery boards 16 mounted on a second side. In one embodiment, each of the power delivery boards 16 is aligned with each one of the ASICs 12.

Figure 4:
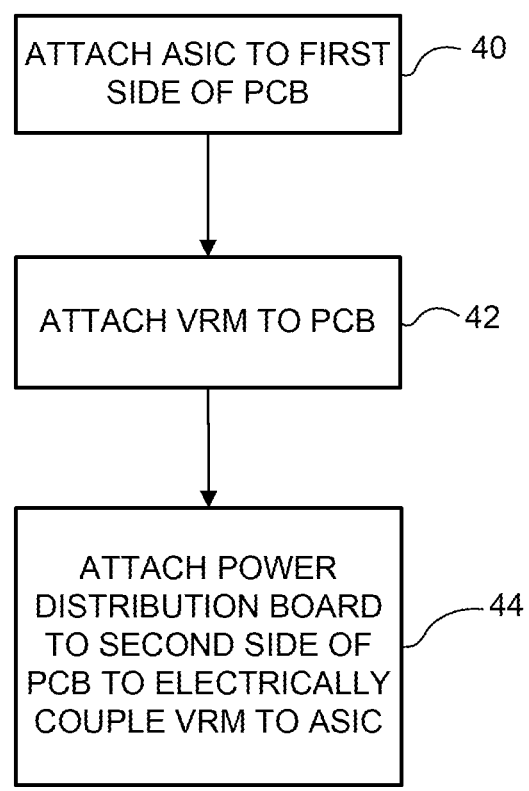
FIG. 4 is a flowchart illustrating an overview of a process for distributing power from the voltage regulator module to the ASIC while bypassing signal vias in the printed circuit board, in accordance with one embodiment.

FIG. 4 is a flowchart illustrating an overview of a process for electrically coupling the VRM 14 and ASIC 12 mounted on the first side 15 of the printed circuit board 10 through the power delivery board 16 mounted on the second side 17 of the printed circuit board (FIG. 1), thereby enhancing power delivery to the ASIC, in accordance with one embodiment. A substrate, such as the printed circuit board 10 shown in FIGS. 1, 2, and 3 and described above is provided. One or more ASICs 12 are mounted to a first side (e.g., top side 15) of the printed circuit board 10 (step 40) (FIGS. 1 and 4). The ASIC 12 may be mounted to the printed circuit board 10 by soldering with a BGA, for example. One or more voltage regulator modules 14 are also mounted on the first side of the printed circuit board 10 (step 42). One or more of the power delivery boards 16 are mounted on a second side (e.g., bottom side 17) of the printed circuit board 10 (e.g., corresponding to the number of ASICs mounted on the PCB) to electrically couple the VRMs 14 and the ASICs 12 through the power planes 28a in the power delivery board 16 and vertically aligned vias (26a, 30a) (24a, 22a) in the power delivery board and printed circuit board, respectively (step 44).

It is to be understood that the process shown in FIG. 4 and described above is only an example and steps may be added, modified, or reordered without departing from the scope of the embodiments. For example, the power delivery board 16 and other components (ASIC 12, VRM 14) may be attached to the printed circuit board 10 in any order.

As can be observed from the foregoing, one or more embodiments described herein provide advantages over conventional systems. For example, by integrating more layers locally through use of the power delivery board, the overall thickness of the printed circuit board is not increased. Also, by reducing power real estate requirements in the printed circuit board, valuable area on the printed circuit board may be freed up, thereby allowing for increased density and reduced complexity. Valuable layers in the printed circuit board may also be freed up or removed by moving the power planes supporting the ASIC from the printed circuit board to the power delivery board.

Although the apparatus and method have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
   a printed circuit board comprising a first side, a second side, a plurality of power vias extending from said first side to said second side, and a first power plane arranged on a surface of the second side, said first side configured for receiving an application specific integrated circuit (ASIC); and
   a power delivery board mounted on said second side of the printed circuit board and comprising a second power plane interconnected with power vias in the power delivery board to electrically couple a voltage regulator module and the ASIC;
   wherein the voltage regulator module is mounted on said second side of the printed circuit board offset from the power delivery board and electrically connected to the power delivery board by the first power plane such that an electrical connection between the voltage regulator module and the power delivery board is provided along the surface of the second side of the printed circuit board.

2. The apparatus of claim 1 wherein the second power plane comprises a plurality of power planes for electrically coupling the voltage regulator module with the ASIC.

3. The apparatus of claim 1 wherein the power delivery board further comprises a plurality of ground vias aligned with ground vias in the printed circuit board.

4. The apparatus of claim 3 wherein the power vias are interleaved with the ground vias in the power delivery board.

5. The apparatus of claim 1 further comprising a second power delivery board mounted on said second side of the printed circuit board and positioned for vertical alignment with a second ASIC.

6. The apparatus of claim 1 wherein the second power plane comprises a plurality of second power planes and wherein one or more power planes of the plurality of second power planes interleave with ground planes in the power delivery board.

7. The apparatus of claim 1, wherein the second power plane is internal to the power delivery board.

8. An apparatus comprising:
   a printed circuit board comprising a first side, a second side, a plurality of power vias extending from said first side to said second side, and a first power plane arranged on a surface of the second side;
   a voltage regulator module mounted on the printed circuit board;
   application specific integrated circuits (ASICs) mounted on said first side of the printed circuit board; and
   one or more power delivery boards mounted on said second side of the printed circuit board at locations aligned with the ASICs, wherein each of the one or more power delivery boards comprises one or more second power planes for transferring power between said plurality of power vias in the printed circuit board;
   wherein the one or more second power planes in the one or more power delivery boards interleave with ground planes in the one or more power delivery boards; and
   wherein an electrical connection between the voltage regulator module and the one or more power delivery boards is provided by the first power plane along the second side of the printed circuit board.

9. The apparatus of claim 8 wherein the one or more second power planes interconnect with a plurality of power vias in the one or more power delivery boards, said plurality of power vias in the one or more power delivery boards vertically aligned with the power vias in the printed circuit board for delivery of power from the voltage regulator module to the ASICs.

10. The apparatus of claim 9 wherein the power vias in the one or more power delivery boards are interleaved with ground vias in the one or more power delivery boards.

11. The apparatus of claim 8 wherein the one or more power delivery boards electrically couple the voltage regulator module mounted on said second side of the printed circuit board to the ASICs.

12. The apparatus of claim 8 wherein each of the one or more power delivery boards is attached to the printed circuit board with a ball grid array or a land grid array.

13. The apparatus of claim 8, wherein the one or more second power planes are internal to the one or more power delivery boards.

14. An apparatus comprising:
   a power delivery board for integration with a printed circuit board, the power delivery board comprising a plurality of power planes for delivering power from voltage regulator modules to an electronic component mounted on a first side of the printed circuit board;
   wherein each of the power planes in the power delivery board interconnects with power vias in the power delivery board to electrically couple the voltage regulator modules to the electronic component when the power delivery board is mounted on a second side of the printed circuit board;
   wherein the power planes in the power delivery board interconnect with one or more power planes along a surface of the second side of the printed circuit board to provide electrical connections between the voltage regulator modules and the power delivery board; and
   wherein the power planes in the power delivery board interleave with ground planes in the power delivery board.

15. The apparatus of claim 14 wherein the voltage regulator modules are mounted on said first side of the printed circuit board.

16. The apparatus of claim 15 wherein power received from each of the voltage regulator modules is delivered on one of the power planes in the power delivery board shared by the voltage regulator modules.

17. The apparatus of claim 14 wherein the power delivery board is attached to the printed circuit board with a ball grid array or a land grid array.

18. The apparatus of claim 14 wherein the power vias in the power delivery board interleave with ground vias in the power delivery board.

19. The apparatus of claim 14 wherein the voltage regulator modules are mounted on said second side of the printed circuit board.

20. The apparatus of claim 14, wherein the power planes in the power delivery board are internal to the power delivery board.

\* \* \* \* \*